(12) United States Patent
Hahn et al.

(10) Patent No.: US 8,395,146 B2
(45) Date of Patent: Mar. 12, 2013

(54) COMPOSITION AND ORGANIC INSULATING FILM PREPARED USING THE SAME

(75) Inventors: Jung Seok Hahn, Yongin-si (KR); Eun Kyung Lee, Yongin-si (KR); Sang Yoon Lee, Yongin-si (KR); Eun Jeong Jeong, Yongin-si (KR); Joo Young Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 178 days.

(21) Appl. No.: 13/067,002

(22) Filed: May 2, 2011

(65) Prior Publication Data

US 2011/0204350 A1    Aug. 25, 2011

Related U.S. Application Data

(62) Division of application No. 11/806,744, filed on Jun. 4, 2007, now abandoned.

(30) Foreign Application Priority Data

Nov. 14, 2006  (KR) .................. 10-2006-0112347

(51) Int. Cl.
*H01L 35/24* (2006.01)
(52) U.S. Cl. .................. 257/40; 257/E51.001
(58) Field of Classification Search .......... 257/40, 257/E51.001
See application file for complete search history.

(56) References Cited

U.S. PATENT DOCUMENTS

| | | | |
|---|---|---|---|
| 5,218,133 A * | 6/1993 | Pepe et al. ............. | 556/420 |
| 5,347,144 A | 9/1994 | Garnier et al. | |
| 5,674,936 A * | 10/1997 | Lucas ................. | 524/731 |
| 5,946,551 A | 8/1999 | Dimitrakopoulos et al. | |
| 6,107,117 A | 8/2000 | Bao et al. | |
| 6,478,861 B1 | 11/2002 | Kwan et al. | |
| 6,780,926 B2 * | 8/2004 | Leempoel et al. ........ | 524/588 |
| 7,399,352 B2 | 7/2008 | Doshi | |
| 2003/0160235 A1 | 8/2003 | Hirai | |
| 2005/0189536 A1 | 9/2005 | Zschieschang et al. | |
| 2006/0235221 A1 * | 10/2006 | Childress et al. ........ | 544/193 |

(Continued)

FOREIGN PATENT DOCUMENTS

| | | |
|---|---|---|
| JP | 2003-253209 | 9/2003 |
| KR | 10-2005-0036171 | 4/2005 |
| WO | 00/79617 | 12/2000 |

OTHER PUBLICATIONS

Francis Garnier et al. "Molecular Engineering of Organic Semiconductors: Design of Self-Assembly Properties in Conjugated Thiophene Oligomers". Journal of American Chemical Society, vol. 115, 1993, pp. 8716-8721.

(Continued)

*Primary Examiner* — Anthony Ho
(74) *Attorney, Agent, or Firm* — Harness, Dickey & Pierce, P.L.C.

(57) ABSTRACT

Disclosed is a composition, an organic insulating film including the same, an organic thin film transistor including the organic insulating film, an electronic device including the organic thin film transistor and methods of fabricating the same. In the composition, an organic polymer material having a carboxyl group and an organic silane material having an electron-donating group are included to thus realize a structure which may further stabilize an unreacted crosslinking material. Thereby, a hysteresis phenomenon may be decreased and transparency may be increased, thus making it possible to assure stability upon exposure to air. Accordingly, the lifetime of the organic thin film transistor may be lengthened.

10 Claims, 7 Drawing Sheets

U.S. PATENT DOCUMENTS

| | | | |
|---|---|---|---|
| 2007/0015893 A1* | 1/2007 | Hakuta et al. | 528/34 |
| 2007/0059211 A1* | 3/2007 | Edmiston | 422/82.11 |
| 2007/0190537 A1* | 8/2007 | Park et al. | 435/6 |
| 2007/0244249 A1* | 10/2007 | Correia | 524/588 |

OTHER PUBLICATIONS

H. Sirringhaus et al. "High-Resolution Inkjet Printing of All-Polymer Transistor Circuits". Science, vol. 290, 2000, pp. 2123-2126.

Christos D. Dimitrakopoulos et al. "Low-Voltage, High-Mobility Pentacene Transistors with Solution-Processed High Dielectric Constant Insulators". Advanced Materials, vol. 11, No. 16, 1999, pp. 1372-1375.

Office Action dated Aug. 27, 2012 by the Korean Patent Office for a counterpart Korean application, KR 10-2006-0112347.

* cited by examiner

COMPOSITION AND ORGANIC INSULATING FILM PREPARED USING THE SAME

PRIORITY STATEMENT

This application is a Divisional of U.S. application Ser. No. 11/806,744 filed Jun. 4, 2007 now abandoned, which claims priority from Korean Patent Application No. 2006-112347, filed on Nov. 14, 2006, in the Korean Intellectual Property Office (KIPO), the entire contents of each of which are herein incorporated by reference.

BACKGROUND

1. Field

Example embodiments relate to a composition and an organic insulating film prepared using the same, an OTFT using the above insulating film, an electronic device using the OTFT and methods of fabricating the same. Other example embodiments relate to a composition, which includes an organic polymer material having a carboxyl group and an organic silane material having an electron-donating group in order to assure the stability upon exposure to air, and to an organic insulating film prepared using the same, an OTFT using the above insulating film, an electronic device using the OTFT and methods of fabricating the same.

2. Description of the Related Art

A thin film transistor (TFT), which is primarily used in display devices, may be composed mainly of an amorphous silicon semiconductor, a silicon oxide insulating film, and metal electrodes. Increasing the diversity of material, an organic thin film transistor (OTFT) using an organic semiconductor has been developed, and has been studied with regard to its applicability.

Such OTFTs are advantageous because a printing process, which takes place under atmospheric pressure, may be used, rather than a plasma-enhanced chemical vapor deposition process, which is the conventional silicon process. In addition, performing a roll-to-roll process using a plastic substrate may be possible, thereby decreasing the cost of fabricating the transistor.

Generally, organic semiconductor material, which is being studied for use in the channel layer of an OTFT, may be largely classified into low-molecular-weight or oligomer material and polymer material. Examples of the low-molecular-weight or oligomer material may include merocyanine, phthalocyanine, perylene, pentacene, thiophene and/or oligothiophene. According to the conventional art, the use of a pentacene thin-film resulted in increased charge mobility of about 3.2 cm$^2$/Vs~about 5.0 cm$^2$/Vs or more. Furthermore, devices using an oligothiophene derivative had relatively increased charge mobility (charge mobility=about 0.01 cm$^2$/Vs~about 0.1 cm$^2$/Vs) and on/off ratio, but a thin film formation process mainly depends on a vacuum process.

As the polymer material, a thiophene-based polymer may be used for manufacturing OTFTs. The OTFTs thus obtained may have properties inferior to those of OTFTs that use low-molecular-weight material but may be advantageous in terms of processibility because a large area may be realized at a reduced price through a solution process, e.g., printing. In this regard, the related art has described the experimental fabrication of a polymer-based OTFT using a polythiophene material, called F8T2 (mobility=about 0.01 cm$^2$/Vs~about 0.02 cm$^2$/Vs). Further, the related art discloses the fabrication of an OTFT using regioregular polythiophene (P3HT) (mobility=about 0.01 cm$^2$/Vs~about 0.04 cm$^2$/Vs). As mentioned above, although the polymer material has TFT properties, e.g., charge mobility, inferior to those of pentacene, which is a low-molecular-weight material, the polymer material may be used because the need for an increased operating frequency may be eliminated and TFTS may be inexpensively fabricated.

Like the organic semiconductor material for the channel layer as above, in order to inexpensively manufacture a flexible OTFT, material for an insulating film, which may be subjected to a solution process, may be researched. Further, a material for an insulating film that improves the performance of OTFTs may also be researched. With the goal of decreasing the threshold voltage, examples may be dielectric materials having a high dielectric constant (high-k), for example, a ferroelectric insulating film, including $Ba_xSr_{1-x}TiO_3$ (BST: Barium Strontium Titanate), $Ta_2O_5$, $Y_2O_3$, or $TiO_2$, and an inorganic insulating film, including $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, or $Bi_4Ti_3O_{12}$, of which part of the materials are applied to OTFTs comprising an active layer formed with pentacene. However, the inorganic oxide material may have no advantages in terms of process compared to using conventional silicon.

When the OTFT is widely applied not only to LCDs but also to devices for driving flexible displays using organic EL, a charge mobility of about 10 cm$^2$/V·sec or more may be required. However, the organic insulating film used therein may have k of about 3~about 4 and requires an increased operating voltage (about 30 V~about 50 V) and threshold voltage (about 15 V~about 20 V).

Moreover, since a solution process enables the inexpensive fabrication of displays having a relatively large area, a polymer insulating film may be a gate insulating film material. As such, when the polymer insulating film is thickly formed due to increased leakage current, an increased operating voltage may result. Therefore, the polymer insulating film may be formed into a thin film having a reduced leakage current and an increased capacity, and should be highly resistant to chemicals, e.g., acids or bases, so as not to dissolve in a solvent used in the preparation of electrodes and/or OSC using a solution process or a printing process.

When LCDs or OLEDs are operated, the operating voltage may increase in proportion to the difference between the voltage required for $I_{on}$ and the voltage required for $I_{off}$. Accordingly, upon the actual use of displays, the device may consume a relatively great amount of power, and may deteriorate, thus becoming unstable. Where hysteresis occurs, a rapid switching speed may not be realized and a display afterimage may undesirably remain. Upon exposure to air, because such a hysteresis phenomenon occurs due to moisture present therein, the development of an organic insulating film that may mitigate such a phenomenon may be needed.

SUMMARY

Example embodiments are provided below for addressing certain of the deficiencies and/or limitations of the related art through the use of a composition, which may alleviate a hysteresis phenomenon and may increase transparency while maintaining the properties of an OTFT, e.g., charge mobility and an insulating film including the composition. Other example embodiments provide an OTFT with the above insulating film and an electronic device with the OTFT.

Example embodiments provide a method of preparing an organic insulating film, comprising applying the above composition on a substrate and then curing the composition, a method of fabricating an OTFT including fabricating the above insulating film and a method of fabricating an electronic device including fabricating the OTFT.

Example embodiments provide a composition, comprising an organic polymer material having a carboxyl group, an organic silane material having an electron-donating group, an organic metal compound, and an organic solvent. Other example embodiments provide an insulating film including the composition.

Example embodiments provide an OTFT, comprising a substrate, a gate electrode, an organic insulating film, an organic semiconductor layer, and source/drain electrodes, the organic insulating film being the organic insulating film including the composition. Other example embodiments provide an electronic device comprising the OTFT.

Example embodiments provide a method of preparing an organic insulating film, wherein the unreacted organic metal compound may be crosslinked or substituted with an organic polymer material having a carboxyl group to thus be made stable. The method may include applying a composition including an organic polymer material having a carboxyl group, an organic silane material having an electron-donating group, an organic metal compound, and an organic solvent to a substrate, and curing the composition.

Other example embodiments provide a method of fabricating an organic thin film transistor which may include forming a gate electrode, an insulating layer, an organic semiconductor layer, and a plurality of pairs of source/drain electrodes on a substrate, wherein the insulating layer is the organic insulating film prepared according to the method above. Other example embodiments provide a method of fabricating an electronic device which may include fabricating the organic thin film transistor according to example embodiments.

BRIEF DESCRIPTION OF THE DRAWINGS

Example embodiments will be more clearly understood from the following detailed description taken in conjunction with the accompanying drawings.

FIG. 1 is a schematic sectional view illustrating the OTFT according to example embodiments;

FIGS. 2 and 3 are graphs illustrating the current transfer properties of the OTFT manufactured in Comparative Example 1, in a nitrogen atmosphere and upon exposure to air, respectively;

FIGS. 4 and 5 are graphs illustrating the current transfer properties of the OTFT manufactured in Example 1, in a nitrogen atmosphere and upon exposure to air, respectively; and FIGS. 6 and 7 are graphs illustrating the current transfer properties of the OTFT manufactured in Example 2, in a nitrogen atmosphere and upon exposure to air, respectively.

Figure 1:
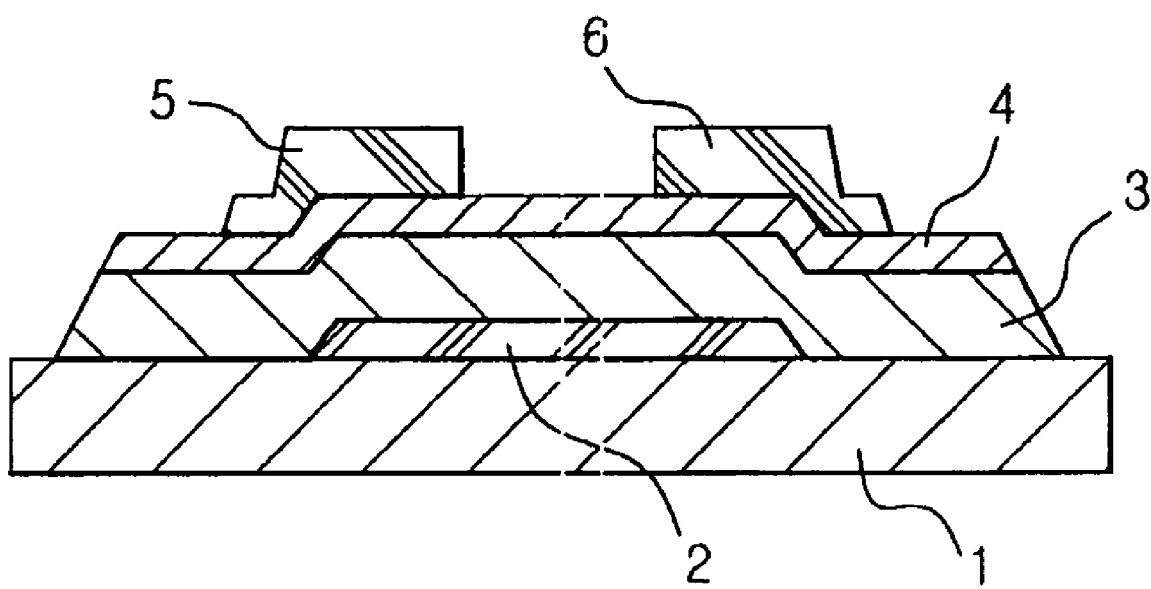
FIGS. 1-7 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the appended drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, the composition may include an organic polymer material having a carboxyl group, an organic silane material having an electron-donating group, an organic metal compound, and an organic solvent. In the composition for the organic insulating film of example embodiments, the organic silane compound may contain, as the electron-donating group, at least one selected from among an amine group, an imine group, a carboxyl group, a phosphoric acid group and/or a sulfonic acid group. For example, the composition of example embodiments may include the organic silane compound represented by Formula 1 below:

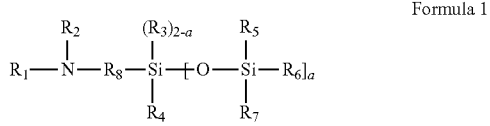

Formula 1 wherein $R_1$ and $R_2$ are each independently hydrogen, a $C_{1\sim30}$ linear, branched or cyclic alkyl group, a $C_{3\sim60}$ cycloalkyl group, a $C_{2\sim30}$ alkenyl group, a $C_{1\sim30}$ acyl group, or a $C_{1\sim30}$ alkoxycarbonyl group, $R_3$, $R_4$, $R_5$, $R_6$ and $R_7$ are each independently hydrogen, halogen, a $C_{1\sim30}$ linear, branched or cyclic alkyl group, a $C_{3\sim60}$ cycloalkyl group, a $C_{2\sim30}$ alkenyl group, a $C_{6\sim30}$ aryl group, or a $C_{1\sim30}$ alkoxy group, at least one of which is composed of a hydrolysable functional group, $R_8$ is a $C_{1\sim8}$ alkylene group, and a is about 0 or about 1.

Furthermore, the organic silane material having an electron-donating group may include the compound represented by Formula 2 below:

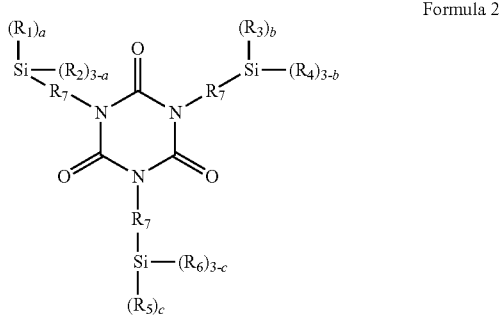

Formula 2 wherein $R_1$, $R_3$ and $R_5$ are each independently halogen, a hydroxyl group, or a $C_{1\sim10}$ alkoxy group, $R_2$, $R_4$ and $R_6$ are each independently hydrogen, halogen, a $C_{1\sim30}$ linear, branched or cyclic alkyl group, or a $C_{3\sim60}$ cycloalkyl group, $R_7$ is a $C_{1\sim8}$ alkylene group, and a, b and c are each an integer from about 0 to about 2.

The organic silane material, which contains an amine group or an imine group, may exhibit an electron-donating effect in the organic insulating film prepared through a curing reaction, and may offset an electron-withdrawing effect of the insulating film constructed to withdraw the electrons, or alternatively, such a material alone may supply the electrons, thus improving the performance of organic transistors.

The organic polymer material of example embodiments may be referred to as a linear or branched polymer material having a carboxyl group, examples of the organic polymer material including polymethylmethacrylate, polyacrylic acid, polymethacrylacrylate, polymethylsorbate, polycarbonate, and polyethylene terephthalate.

The organic polymer material may function to increase the crosslinking property of the organic insulating film and maximize or enhance the properties of the organic thin film so as to stabilize the insulating film, and may increase transparency, and react with the unreacted organic metal compound. Generally, the organic metal compound, which is the material for an insulating film having high-k, may be added as a crosslinking agent. Because the dielectric performance varies with the type of metal, such an organic metal compound may be added in a greater amount than the amount required for a crosslinking reaction. The unreacted organic metal compound may form a predetermined or given domain or may be adsorbed, and may undesirably play a role in causing hysteresis. Accordingly, in example embodiments, the organic metal compound that remains after the crosslinking reaction may be crosslinked or substituted with the organic polymer material having the carboxyl group, such that the organic metal compound becomes more stable. Thereby, hydroscopicity and hydrolization, which incur hysteresis, may be prevented or reduced.

Further, the organic polymer material may more easily form a thin film and may increase the transparency of the organic film. Where the organic insulating film including the organic polymer material is a main component, optical transparency may be higher than for conventional organic insulating films.

The organic polymer material may be used in an amount of about 20~about 400 parts by weight, for example, about 40~about 70 parts by weight, based on about 100 parts by weight of the organic silane material. When the amount exceeds about 400 parts by weight, the desired effect of the organic metal compound may not be obtained and the leakage current of the manufactured device may be increased. On the other hand, when the amount is less than about 20 parts by weight, a homogeneous composition may not be obtained and the morphology of the resultant thin film may be undesirable.

The organic metal compound used in the composition for the organic insulating film, according to example embodiments, may be regarded as a high-k material exhibiting improved insulating properties, and may include metal oxides having k of about 4 or more. As the organic metal compound, at least one selected from among a titanium compound, a zirconium compound, a hafnium compound, and an aluminum compound may be used. Specific examples thereof may include, but may not be limited to, a titanium compound, e.g., titanium (IV) n-butoxide, titanium (IV) t-butoxide, titanium (IV) ethoxide, titanium (IV) 2-ethylhexoxide, titanium (IV) iso-propoxide, titanium (IV) (di-iso-propoxide) bis(acetylacetonate), titanium (IV) oxide bis(acetylacetonate), trichlorotris (tetrahydrofuran)titanium (III), tris (2,2,6,6-tetramethyl- 3,5-heptanedionato)titanium (III), (trimethyl) pentamethyl cyclopentadienyl-titanium (IV), pentamethylcyclo pentadienyltitanium trichloride (IV), pentamethylcyclo-pentadienyltitanium trimethoxide (IV), tetrachlorobis(cyclohexylmercapto) titanium(IV), tetrachloro bis(tetrahydrofuran) titanium (IV), tetrachlorodiamine titanium (IV), tetrakis (diethylamino)titanium (IV), tetrakis (dimethylamino) titanium (IV), bis(t-butylcyclo pentadienyl)titanium dichloride, bis(cyclopentadienyl) dicarbonyl titanium (II), bis(cyclopentadienyl)titanium dichloride, bis(ethylcyclopentadienyl)titanium dichloride, bis(pentamethylcyclopentadienyl)titanium dichloride, bis(iso-propylcyclopentadienyl)titanium dichloride, tris(2,2,6,6-tetramethyl-3,5-heptanedionato)oxotitanium (IV), chlorotitanium triisopropoxide, cyclopentadienyl titanium trichloride, dichlorobis(2,2,6,6-tetramethyl-3,5-heptanedionato)titanium (IV), dimethylbis(t-butylcyclopentadienyl)titanium (IV), and/or di(iso-propoxide)bis(2,2,6,6-tetramethyl-3,5-heptanedionato) titanium (IV), a zirconium compound, e.g., zirconium (IV) n-butoxide, zirconium (IV) t-butoxide, zirconium (IV) ethoxide, zirconium (IV) iso-propoxide, zirconium (IV) n-propoxide, zirconium (IV) acetylacetonate, zirconium (IV) hexafluoroacetylacetonate, zirconium (IV) trifluoroacetylacetonate, tetrakis (diethylamino)zirconium, tetrakis(dimethylamino) zirconium, tetrakis(2,2,6,6-tetramethyl-3,5-heptanedionato) zirconium (IV), and/or zirconium (IV) sulfate tetrahydrate, a hafnium compound, e.g., hafnium (IV) n-butoxide, hafnium (IV) t-butoxide, hafnium (IV) ethoxide, hafnium (IV) iso-propoxide, hafnium (IV) iso-propoxide monoisopropylate, hafnium (IV) acetylacetonate and/or tetrakis(dimethylamino)hafnium, and an aluminum compound, e.g., aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate, and tris(2,2,6,6-tetramethyl-3,5-heptanedionato)aluminum.

In the composition of example embodiments, the organic metal compound may be used in an amount of about 10~about 40 parts by weight, based on about 100 parts by weight of the organic silane material. When the amount is less than about 10 parts by weight, the degree of crosslinking by the organic metal compound may be decreased and a high-k effect may not be achieved. On the other hand, when the amount exceeds about 40 parts by weight, a homogeneous composition may not be obtained and the leakage current of the obtained device may be undesirably increased.

In the composition of example embodiments, the organic solvent may include any material that is used for preparation of an organic insulating film, specific examples thereof including, but not being limited to, an aliphatic hydrocarbon solvent, e.g., hexane and/or heptane, an aromatic hydrocarbon solvent, e.g., toluene, pyridine, quinoline, anisol, mesitylene or xylene, a ketone-based solvent, e.g., cyclohexanone, methyl ethyl ketone, 4-heptanone, methyl isobutyl ketone, 1-methyl-2-pyrrolidinone and/or acetone, an ether-based solvent, e.g., tetrahydrofuran and/or isopropyl ether, an acetate-based solvent, e.g., ethyl acetate, butyl acetate and/or propyleneglycol methyl ether acetate, an amide-based solvent, e.g., dimethylacetamide and/or dimethylformamide, a silicon-based solvent, and mixtures thereof. The organic solvent may be used in an amount of about 500~about 2000 parts by weight, based on about 100 parts by weight of the organic silane material.

In addition, example embodiments provide a method of preparing an organic insulating film by applying the composition as mentioned above on a substrate and then performing thermal treatment. Examples of the process of applying the composition on the substrate may include spin coating, dip coating, roll coating, screen coating, spray coating, spin casting, flow coating, screen printing, ink jetting and/or drop casting. Among them, spin coating and/or printing may be used in the interest of convenience and uniformity. Where the spin coating process is performed, the spin rate may be set in the range from about 00 rpm to about 5000 rpm.

The thermal treatment process for the formation of the organic insulating layer may be conducted in such a manner that the substrate may be heated to about 50° C.~about 250° C. for a time period ranging from about 10 min to about 3 hours for curing. In the method of preparing the organic insulating film, the curing process may function to allow the unreacted organic metal compound to crosslink or substitute with the organic polymer material, having a carboxyl group, to thus stabilize the organic metal compound. Further, the organic silane material having an amine group or an imine group may function to decrease the effects of hydrogen ions and trace ions, which may be generated upon crosslinking or polymerization, on hysteresis.

FIG. 1 schematically illustrates the OTFT of example embodiments. As illustrated in FIG. 1, the OTFT may include a substrate 1, a gate electrode 2, an organic insulating layer 3, an organic semiconductor layer 4, and source/drain electrodes 5, 6, and may have variously modified structures, in addition to the above structure, within a range that does not inhibit the purpose of example embodiments.

The substrate 1 of the OTFT of example embodiments may not be particularly limited, and may be a glass substrate, a silica substrate and/or a plastic substrate.

In the gate electrode 2 and the source/drain electrodes 5, 6 of the OTFT of example embodiments, a typical metal or conductive polymer may be used, specific examples thereof including, but not being limited to, doped silicon (Si), gold (Au), silver (Ag), aluminum (Al), copper (Cu), nickel (Ni), chromium (Cr), molybdenum (Mo), tungsten (W), and indium tin oxide (ITO). After the substrate is washed to remove impurities therefrom, the above-mentioned metal may be deposited through a conventional process, e.g., chemical vapor deposition, plasma-enhanced chemical vapor deposition and/or sputtering, and then patterned to thus form the gate electrode.

The organic insulating layer 3 may be formed by applying the composition of example embodiments using a solution process, e.g., spin coating and/or spin casting, and then curing the composition.

In the organic semiconductor layer 4, a conventional material may be used, specific examples thereof including, but not being limited to, pentacene, polythiophene, polyaniline, polyacetylene, polypyrrole, polyphenylene vinylene, and derivatives thereof.

When preparing the organic insulating layer of the OTFT using the composition of example embodiments, the OTFT may have improved unit properties and thus may be effectively applied to the fabrication of various electronic devices, e.g., LCDs, photovoltaic devices, OLEDs, sensors, memory and/or ICs.

A better understanding of example embodiments may be obtained in light of the following examples, which are set forth to illustrate, but are not to be construed to limit example embodiments.

Example 1

A poly(oligothiophene-thiazole) derivative (MW: about 40000, degree of polymerization: about 20) was dissolved to about 1 wt % in chlorobenzene to thus prepare a composition for forming a semiconductor layer. Further, a composition for forming an organic insulating film was prepared by mixing components and a toluene solvent, as shown in Table 1 below, to prepare a mixture, which was then filtered (about 0.20 mm).

TABLE 1

| Polymethylmethacrylate (PMMA) (M = 120K) | Trimethoxysilylpropyl-ethylcarbamate | Titanium t-Butoxide (Ti(OBu)$_4$) | Toluene |
|---|---|---|---|
| 1 | 1 | 0.3 | 6 |

On a washed glass substrate, Al for a gate electrode was deposited to about 1000 Å through sputtering, after which the material for an organic insulating film was applied through spin coating and then thermally treated at about 200° C. for about 1 hour, thus preparing an organic insulating film about 20,000 Å thick. The composition for a semiconductor layer was applied to a thickness of about 50 nm~about 100 nm thereon and then thermally treated at about 100° C. for about 1 hour, thus preparing an organic semiconductor layer. Source/drain electrodes were formed with gold (Au) through vacuum deposition using a shadow mask having a channel length of about 100 μm and a channel width of about 1 mm, thereby manufacturing an OTFT.

Example 2

An OTFT was manufactured in the same manner as in Example 1, with the exception that the composition was prepared using tris(3-trimethoxysilylpropyl)isocyanate as the organic silane material having an electron-donating group, as shown in Table 2 below.

TABLE 2

| Polymethylmethacrylate (PMMA) (M = 120K) | Tris(3-trimethoxy silylpropyl)isocyanate | Titanium t-Butoxide (Ti(OBu)$_4$) | Toluene |
|---|---|---|---|
| 1 | 1 | 0.3 | 6 |

Comparative Example 1

An OTFT was manufactured in the same manner as in Example 1, with the exception that about 2.0 g of (3-acryloxypropyl)trimethoxysilane and about 0.3 g of titanium t-butoxide were added to about 6.0 g of a toluene solvent and then thoroughly mixed to thus form the composition.

In order to evaluate the electrical properties of the OTFTs manufactured in Examples 1 and 2 and Comparative Example 1, the current transfer properties thereof were measured using a semiconductor characterization system (4200-SCS), available from Keithley. The properties of the OTFT were measured in a nitrogen (N$_2$) atmosphere using a nitrogen glove box, after which the OTFT was allowed to stand for about 24 hours or more in the presence of air, and then the properties thereof were measured in a state of exposure to air. The results are shown in FIGS. 2 to 7, and the electrical properties thereof are given in Table 3 below. Also, visible light transmittance is given in Table 4 below.

TABLE 3

| Measure. | | $I_{on}$ (A) | $I_{off}$ (A) | Mobility (cm$^2$/Vs) | Hys (V) | $V_T$ (V) |
|---|---|---|---|---|---|---|
| C. Ex. 1 | N$_2$ | 2.42E−07 | 4.07E−12 | 0.017 | 0.50 | 10.0 |
| | Air | 1.69E−07 | 4.26E−12 | 0.040 | 28.50 | −11.9 |
| Ex. 1 | N$_2$ | 8.51E−08 | 4.01E−12 | 0.023 | 1.50 | 2.5 |
| | Air | 7.44E−08 | 1.91E−12 | 0.018 | 1.50 | 8.1 |
| Ex. 2 | N$_2$ | 3.16E−08 | 1.05E−11 | 0.00470 | 0.00 | 3.7 |
| | Air | 1.47E−07 | 1.28E−12 | 0.01624 | 0.50 | 21.8 |

TABLE 4

| No. | Visible Light Transmittance (%) |
|---|---|
| C. Ex. 1 | 78 |
| Ex. 1 | 96 |
| Ex. 2 | 92 |

The charge mobility was calculated using the following current equation for the saturation region. That is, the current equation for the saturation region was converted into a graph of $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, μ or $\mu_{FET}$ is charge mobility, $C_o$ is oxide film capacitance, W is the channel width, L is the channel length, $V_G$ is the gate voltage, and $V_T$ is the threshold voltage.

The threshold voltage ($V_T$) was determined as the intersection between the $V_G$ axis and the extrapolated linear region in the graph of $(I_{SD})^{1/2}$ and $V_G$ converted from the current equation for the saturation region using the current transfer curve. When the absolute value of the threshold voltage is close to about 0, less power may be consumed.

The off-current ($I_{off}$), which is current flowing in the off-state, was determined to be the minimum current in the off-state in the on/off current ratio. The on-current ($I_{on}$), which is current flowing in the on-state, was determined to be the maximum current in the on-state in the on/off current ratio.

The hysteresis was calculated using the difference in threshold voltage between the forward sweep and the backward sweep.

Figure 2:
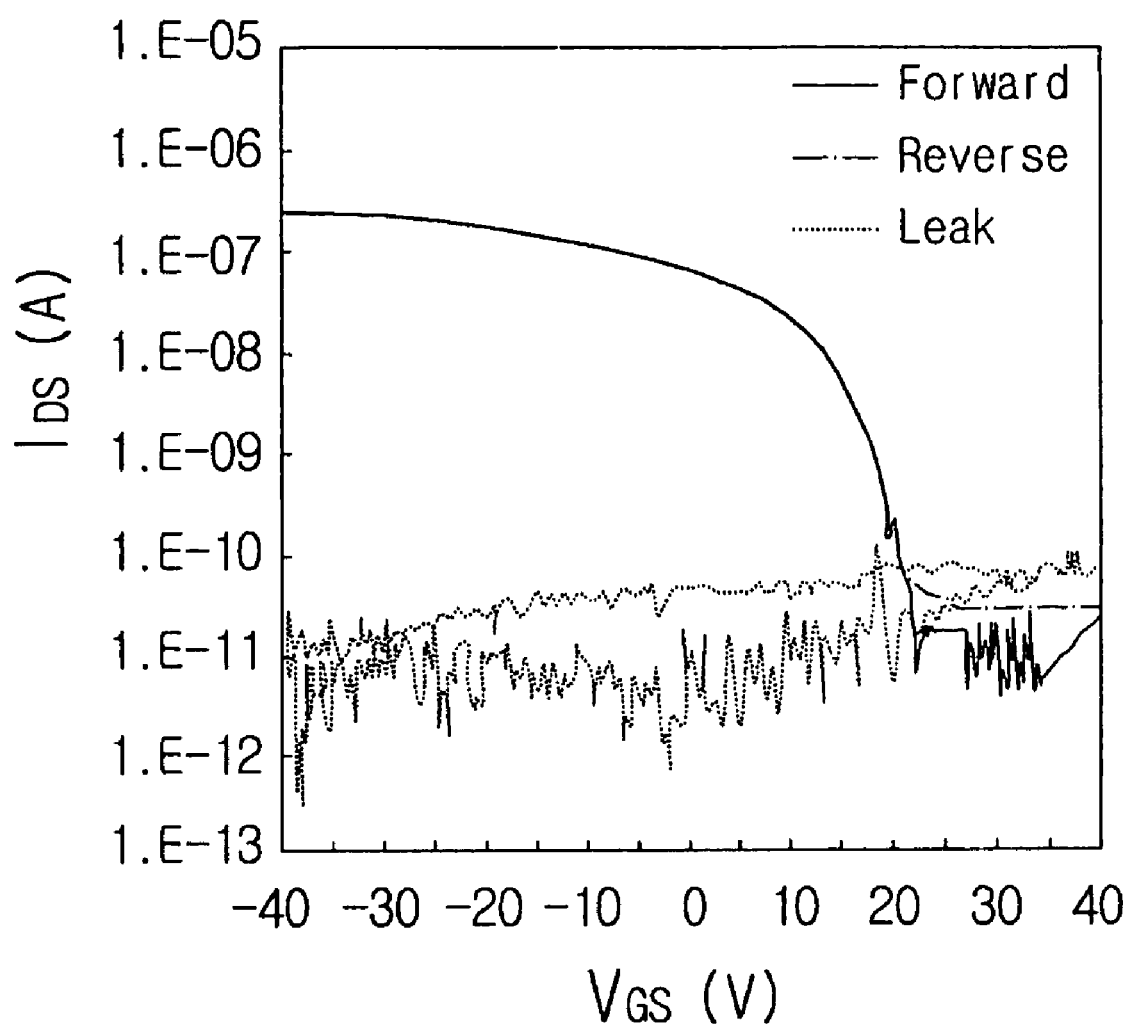
Figure 3:
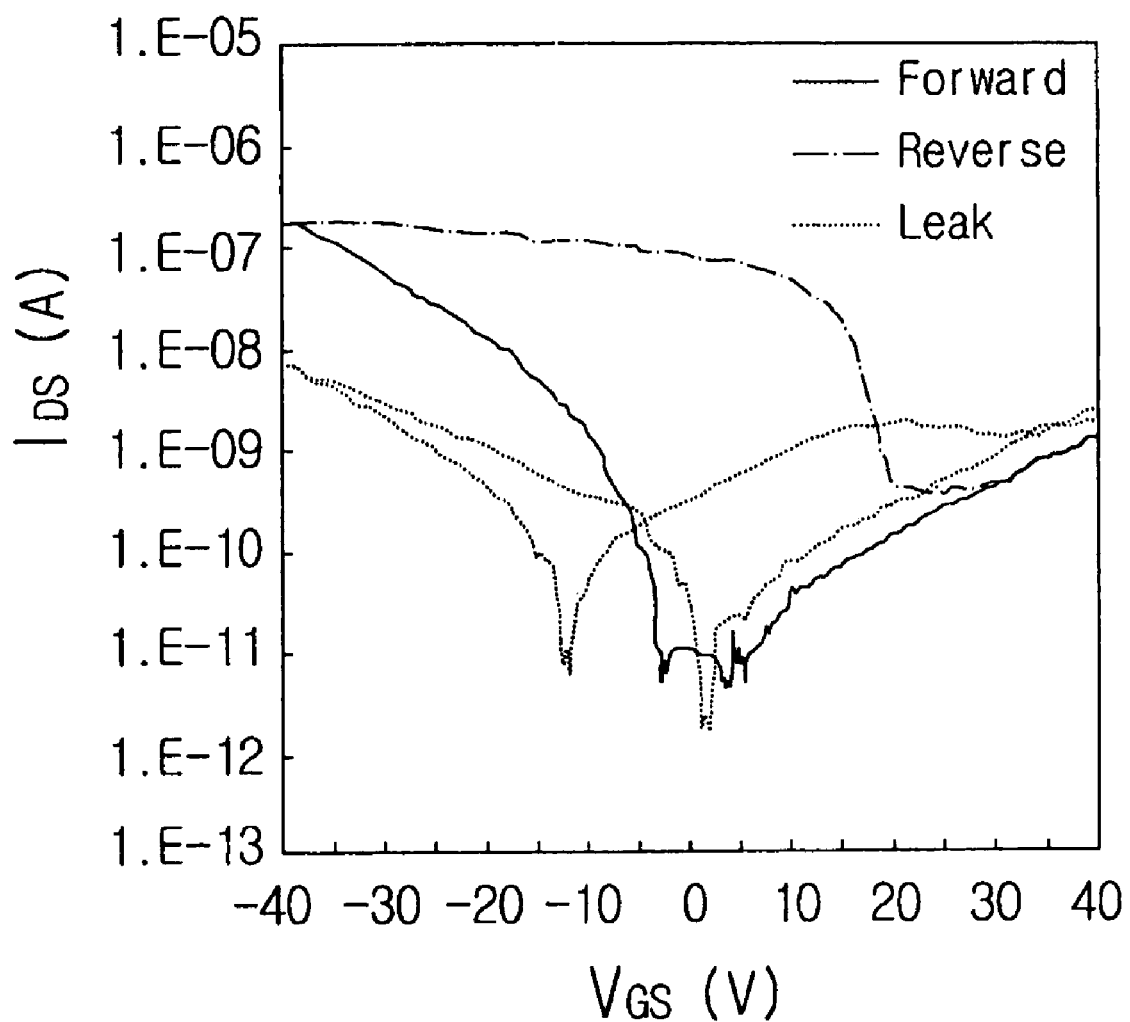
Figure 4:
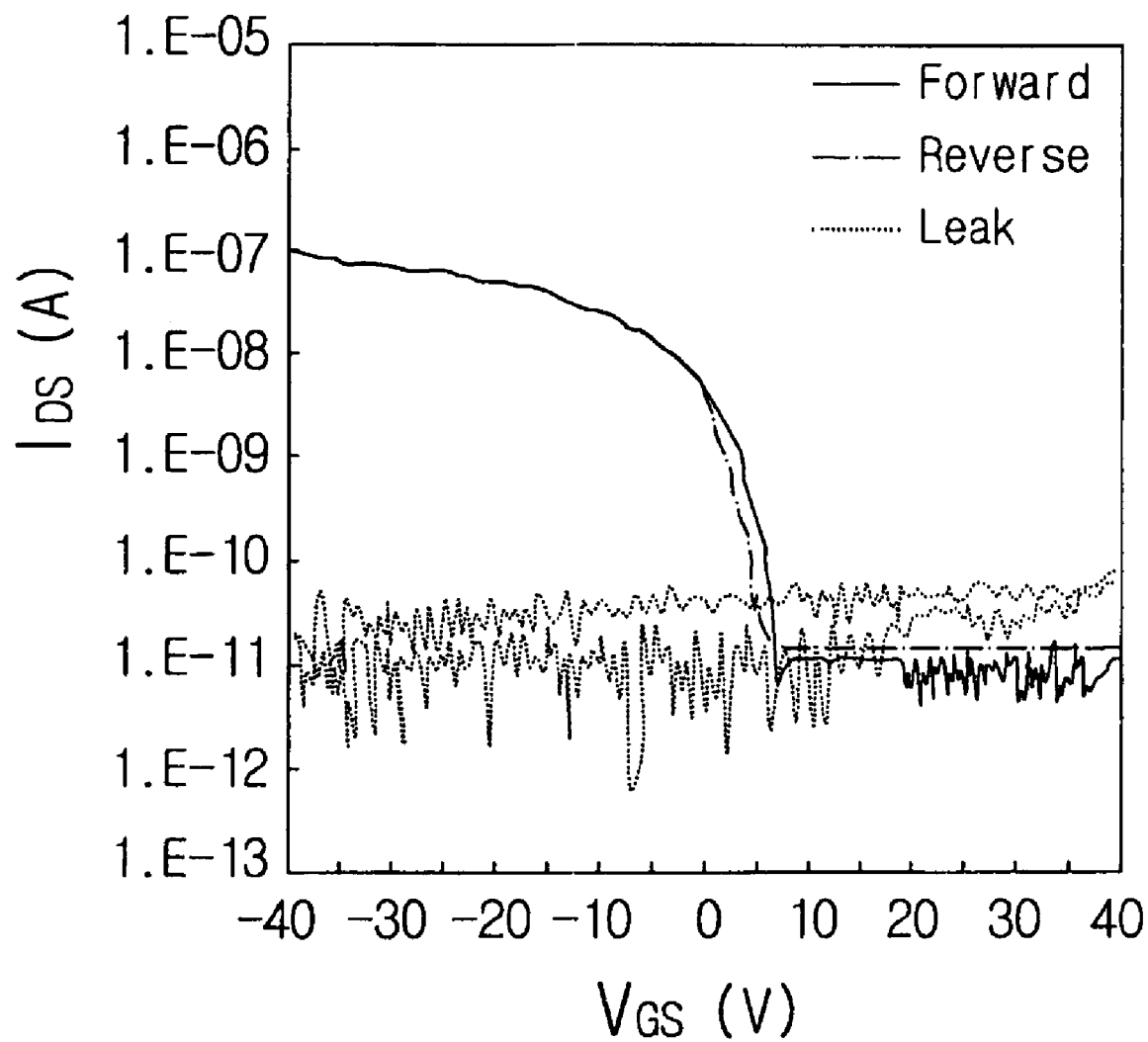
Figure 5:
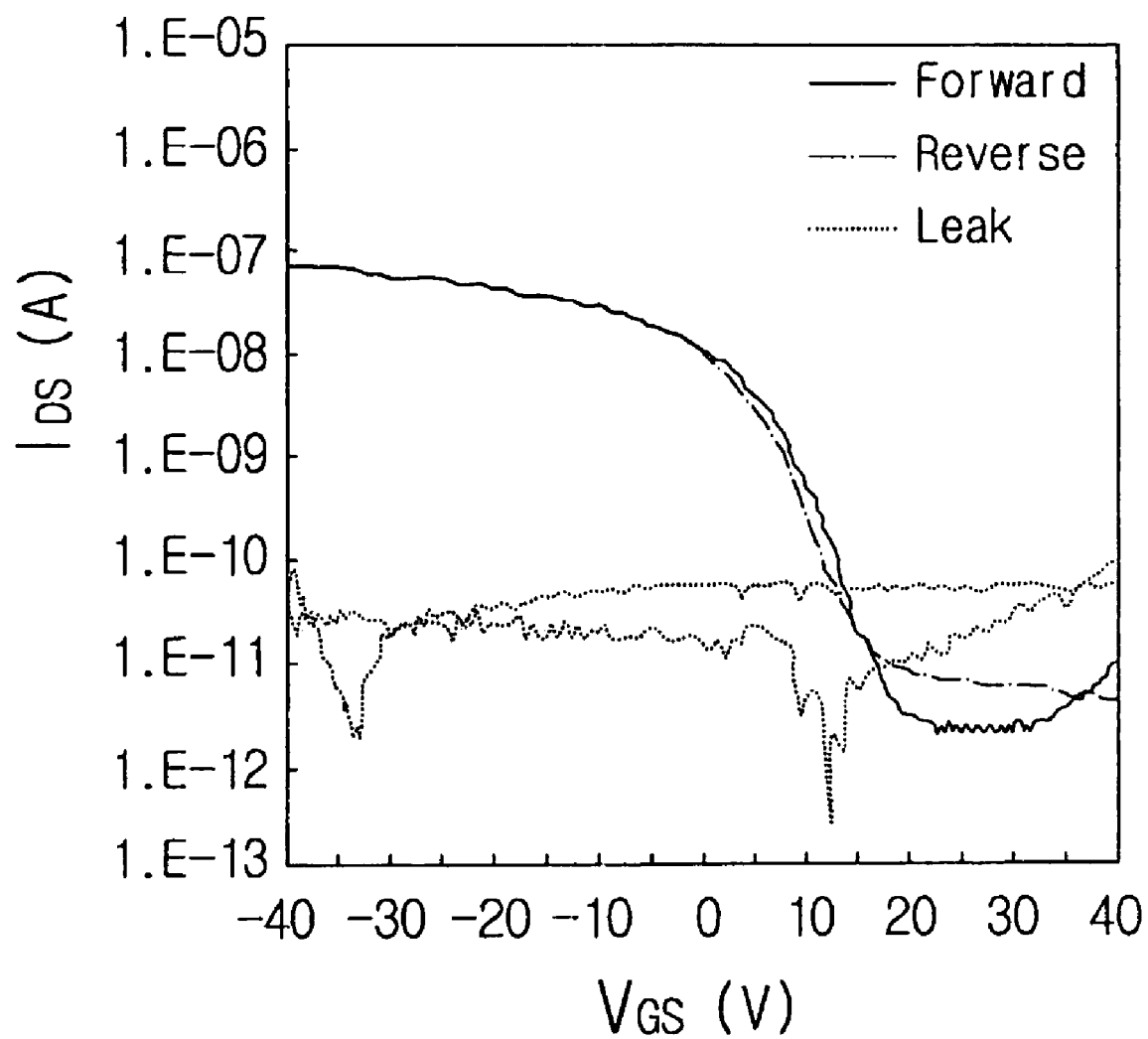

With reference to FIGS. 2 and 3, the OTFT using the composition of Comparative Example 1 exhibited a hysteresis value of about 28.50 V or more upon exposure to air. However, as shown in FIGS. 4 and 5, the OTFT using the composition of Example 1 exhibited a hysteresis value of about 1.50 V, which satisfies the range of less than about 10 V as the requirement for actual display operation.

Figure 6:
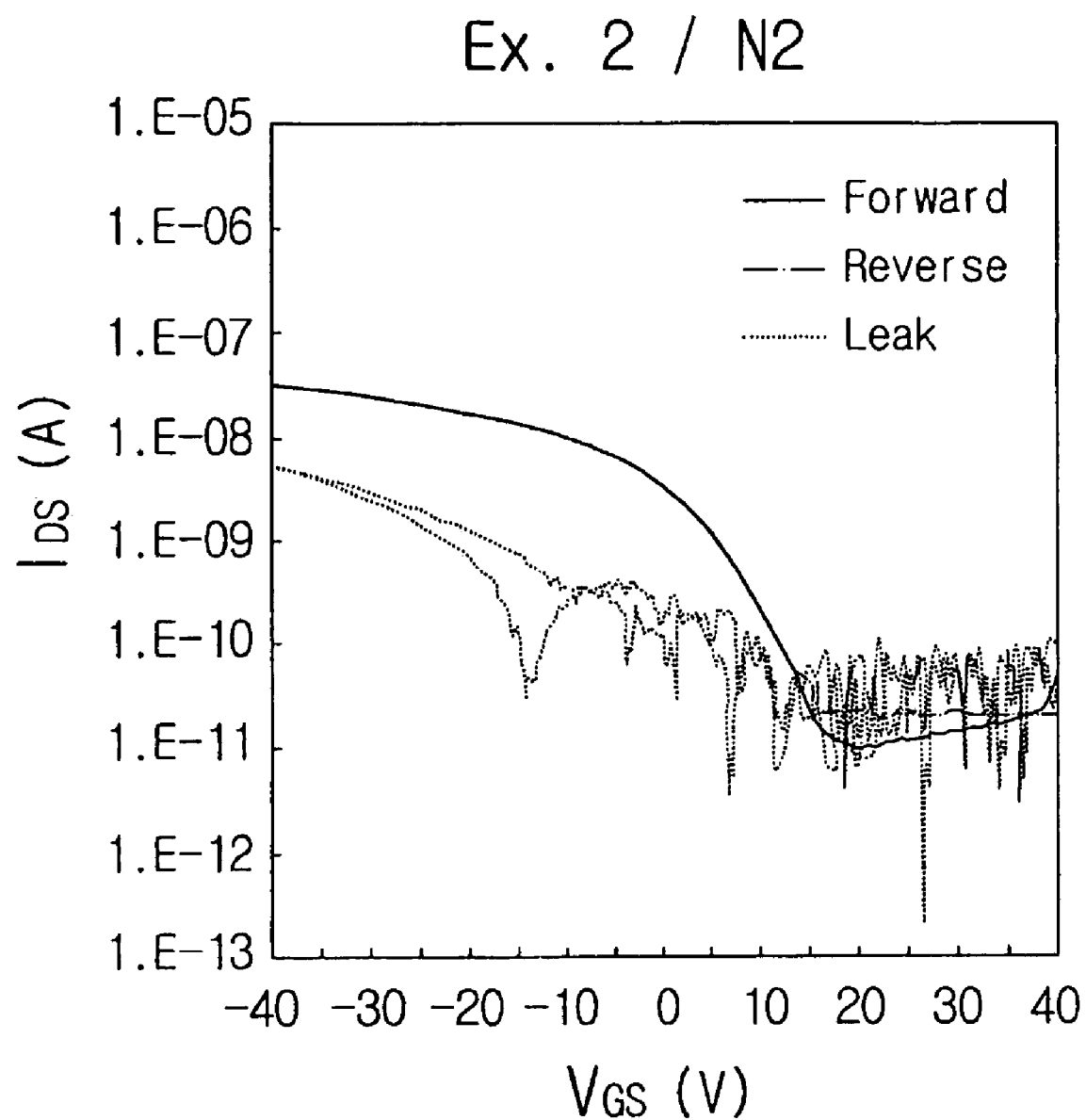
Figure 7:
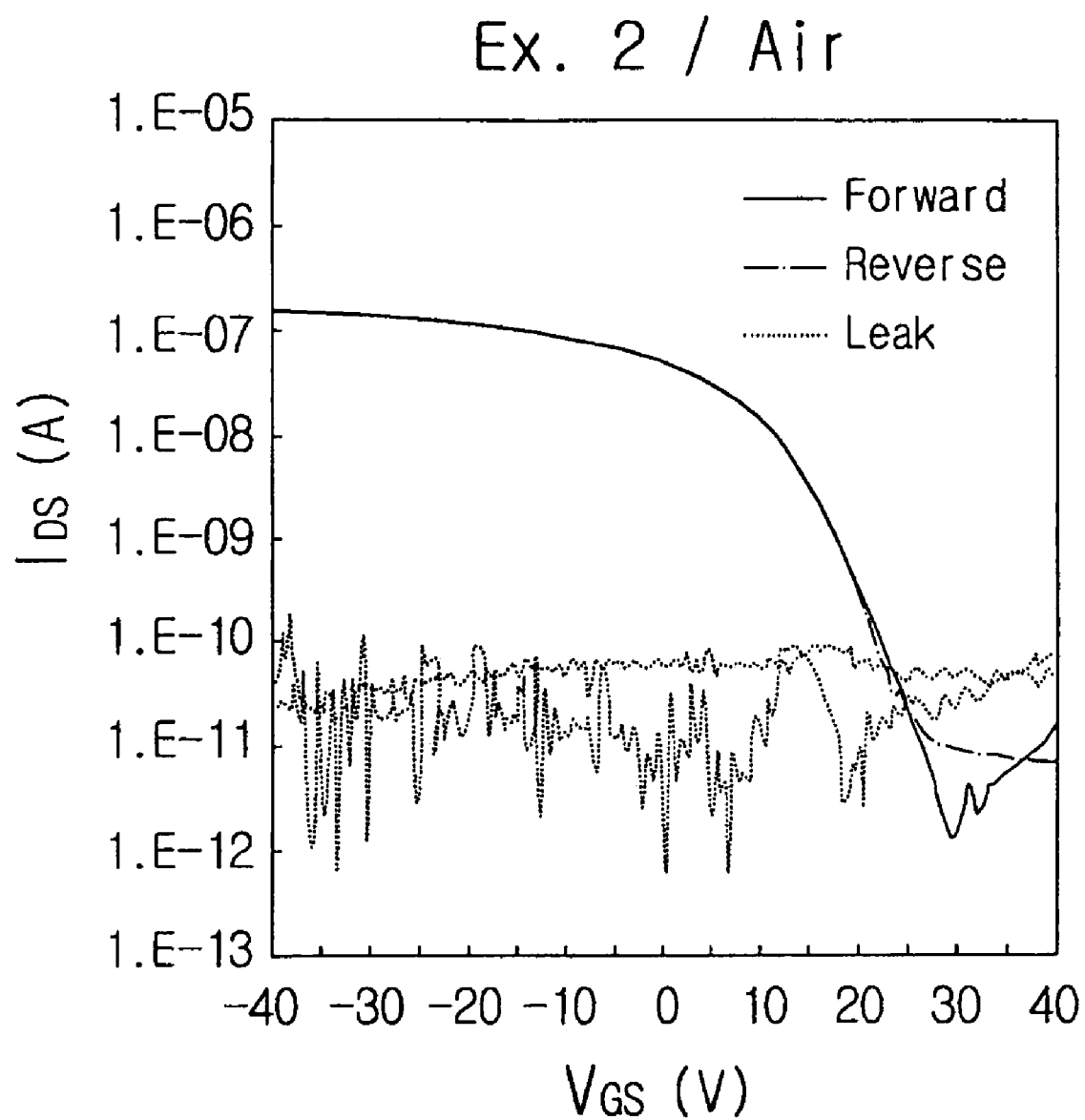

Further, as seen in FIGS. 6 and 7 (Example 2), the OTFT using the composition constructed as in Table 2 also manifested a relatively low hysteresis value of about 0.50 V upon exposure to air.

As is apparent from Table 3, the OTFT manufactured using the composition of example embodiments could realize improved electrical insulating properties, maintain operating properties, e.g., improved charge mobility, and improve the properties, e.g., threshold voltage, while alleviating hysteresis.

As is also apparent from Table 4, the OTFTs of Examples 1 and 2 exhibited much higher transparency than the comparative example. Therefore, the organic insulating film of example embodiments may be more usefully applied to display devices.

As described hereinbefore, example embodiments provide a composition and an organic insulating film prepared using the same. The organic insulating film of example embodiments may be resistant to moisture and chemicals upon exposure to air, thus decreasing hysteresis and increasing transparency. Consequently, the organic insulating film of example embodiments may be effectively applied to display devices.

Although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A composition comprising:

an organic polymer material having a carboxyl group;

an organic silane material having an electron-donating group;

an organic metal compound; and an organic solvent, wherein the organic silane material having the electron-donating group is a compound represented by Formula 1 or Formula 2 below:

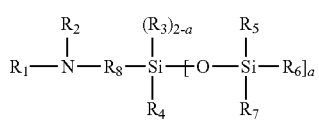

Formula 1 wherein $R_1$ and $R_2$ are each independently hydrogen, a $C_{1\sim30}$ linear, branched or cyclic alkyl group, a $C_{3\sim60}$ cycloalkyl group, a $C_{2\sim30}$ alkenyl group, a $C_{1\sim30}$ acyl group, or a $C_{1\sim30}$ alkoxycarbonyl group, $R_3$, $R_4$, $R_5$, $R_6$ and $R_7$ are each independently hydrogen, halogen, a $C_{1\sim30}$ linear, branched or cyclic alkyl group, a $C_{3\sim60}$ cycloalkyl group, a $C_{2\sim30}$ alkenyl group, a $C_{6\sim30}$ aryl group, or a $C_{1\sim30}$ alkoxy group, at least one of which is composed of a hydrolysable functional group, $R_8$ is a $C_{1\sim8}$ alkylene group, and a is about 0 or about 1,

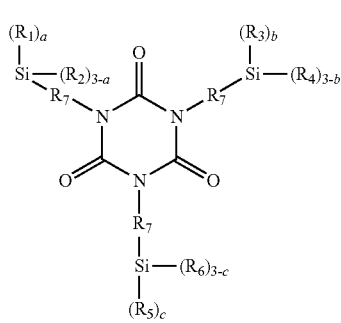

Formula 2 wherein $R_1$, $R_3$ and $R_5$ are each independently halogen, a hydroxyl group, or a $C_{1\sim10}$ alkoxy group, $R_2$, $R_4$ and $R_6$ are each independently hydrogen, halogen, a $C_{1\sim30}$ linear, branched or cyclic alkyl group, or a $C_{3\sim60}$ cycloalkyl group, $R_7$ is a $C_{1\sim8}$ alkylene group, and a, b and c are each an integer from about 0 to about 2.

2. The composition as set forth in claim 1, wherein the organic polymer material having a carboxyl group is at least one selected from the group consisting of polymethylmethacrylate, polyacrylic acid, polymethacrylacrylate, polymethylsorbate, polycarbonate, and polyethylene terephthalate.

3. The composition as set forth in claim 1, wherein the organic metal compound is at least one selected from the group consisting of a titanium compound, a zirconium compound, a hafnium compound, and an aluminum compound.

4. The composition as set forth in claim 3, wherein the organic metal compound is selected from the group consisting of titanium (IV) n-butoxide, titanium (IV) t-butoxide, titanium (IV) ethoxide, titanium (IV) 2-ethylhexoxide, titanium (IV) iso-propoxide, titanium (IV) (di-iso-propoxide) bis(acetylacetonate), titanium (IV) oxide bis(acetylacetonate), trichlorotris(tetrahydrofuran)titanium (III), tris (2,2,6, 6-tetramethyl-3,5-heptanedionato)titanium (III), (trimethyl) pentamethyl cyclopentadienyl-titanium (IV), pentamethyl-cyclopentadienyltitanium trichloride (IV), pentamethylcyclo-pentadienyltitanium trimethoxide (IV), tetrachlorobis (cyclohexylmercapto) titanium (IV), tetra chlorobis (tetrahydrofuran)titanium (IV), tetrachlorodiamine titanium (IV), tetrakis(diethylamino)titanium (IV), tetrakis(dimethylamino)titanium (IV), bis(t-butylcyclopentadienyl)titanium dichloride, bis(cyclo pentadienyl)dicarbonyl titanium (II), bis(cyclopentadienyl)titanium dichloride, bis(ethylcyclopentadienyl)titanium dichloride, bis(pentamethyl cyclopentadienyl)titanium dichloride, bis(iso-propylcyclopentadienyl)titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptanedionato)titanium (IV), dimethylbis(t-butylcyclopentadienyl)titanium (IV), di(iso-propoxide)bis(2,2,6,6-tetramethyl-3,5-heptanedionato) titanium (IV), zirconium (IV) n-butoxide, zirconium (IV) t-butoxide, zirconium (IV) ethoxide, zirconium (IV) iso-propoxide, zirconium (IV) n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino) zirconium, tetrakis(2,2,6,6-tetramethyl-3,5-heptanedionato) zirconium (IV), zirconium (IV) sulfate tetrahydrate, hafnium (IV) n-butoxide, hafnium (IV) t-butoxide, hafnium (IV) ethoxide, hafnium (IV) iso-propoxide, hafnium (IV) iso-propoxide monoisopropylate, hafnium (IV) acetylacetonate, tetrakis (dimethylamino)hafnium, aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate, and tris(2,2,6,6-tetramethyl-3,5-heptanedionato)aluminum.

5. The composition as set forth in claim 1, wherein the organic solvent is at least one selected from the group consisting of an aliphatic hydrocarbon solvent including hexane or heptane, an aromatic hydrocarbon solvent including toluene, pyridine, quinoline, anisol, mesitylene or xylene, a ketone-based solvent including cyclohexanone, methyl ethyl ketone, 4-heptanone, methyl isobutyl ketone, 1-methyl-2-pyrrolidinone or acetone, an ether-based solvent including tetrahydrofuran or isopropyl ether, an acetate-based solvent including ethyl acetate, butyl acetate or propyleneglycol methyl ether acetate, an amide-based solvent including dimethylacetamide or dimethylformamide, a silicon-based solvent, and mixtures thereof.

6. The composition as set forth in claim 1, wherein the composition contains about 100 parts by weight of the organic silane material having an electron-donating group, about 20~about 40 parts by weight of the organic polymer material having a carboxyl group, about 10~about 40 parts by weight of the organic metal compound, and about 500~about 2000 parts by weight of the organic solvent.

7. An organic insulating film comprising the composition of claim 1.

8. An organic thin film transistor comprising a substrate, a gate electrode, an insulating layer, an organic semiconductor layer, and a plurality of pairs of source/drain electrodes, wherein the insulating layer is the organic insulating film of claim 7.

9. An electronic device comprising the organic thin film transistor of claim 8.

10. The electronic device as set forth in claim 9, wherein the electronic device is a liquid crystal display, a photovoltaic device, an organic light emitting diode, a sensor, memory, or an integrated circuit.

* * * * *